United States Patent
Lim et al.

(10) Patent No.: US 12,538,810 B2
(45) Date of Patent: Jan. 27, 2026

(54) MOLDED PACKAGE HAVING AN ELECTRICALLY CONDUCTIVE CLIP WITH A CONVEX CURVED SURFACE ATTACHED TO A SEMICONDUCTOR DIE

(71) Applicant: Infineon Technologies AG, Neubiberg (DE)

(72) Inventors: Wee Aun Jason Lim, Melaka (MY); Marie Hazel Barozzo Gabrillo, Villach (AT); Chai Chee Lee, Melaka (MY); Nor Haqimi Mohamed, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 609 days.

(21) Appl. No.: 17/944,657

(22) Filed: Sep. 14, 2022

(65) Prior Publication Data
US 2024/0087993 A1    Mar. 14, 2024

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4825* (2013.01); *H01L 21/4842* (2013.01);
(Continued)

(58) Field of Classification Search
CPC ........... H01L 23/49548; H01L 23/3107; H01L 23/49517; H01L 24/32; H01L 2224/32245
See application file for complete search history.

(56) References Cited

U.S. PATENT DOCUMENTS

| 4,935,803 A | 6/1990 | Kalfus et al. |
| 5,001,545 A | 3/1991 | Kalfus et al. |

(Continued)

FOREIGN PATENT DOCUMENTS

DE   68926645 T2   1/1997

OTHER PUBLICATIONS

Machine English Translation of KR 20220071415, Suk M. S., Semiconductor Package, published May 31, 2022.*

*Primary Examiner* — Peniel M Gumedzoe
(74) *Attorney, Agent, or Firm* — Murphy, Bilak & Homiller, PLLC

(57) ABSTRACT

A molded package includes: a semiconductor die; a substrate attached to a bottom side of the semiconductor die; an electrically conductive clip attached to a top side of the semiconductor die; and a mold compound encapsulating the semiconductor die. A top side of the electrically conductive clip faces away from the semiconductor die and has an exposed flat surface that overlays the semiconductor die and is not covered by the mold compound. A bottom side of the electrically conductive clip faces the semiconductor die and has a convex curved surface that is attached to the top side of the semiconductor die. Along a vertical cross-section of the electrically conductive clip from the exposed flat surface to the convex curved surface, the electrically conductive clip has a plano-convex shape delimited by the exposed flat surface and the convex curved surface. A method of producing the molded package is also described.

13 Claims, 5 Drawing Sheets

(51) Int. Cl.
    *H01L 21/56*    (2006.01)
    *H01L 23/00*    (2006.01)
    *H01L 23/31*    (2006.01)

(52) U.S. Cl.
    CPC .......... *H01L 21/56* (2013.01); *H01L 23/3107* (2013.01); *H01L 23/49517* (2013.01); *H01L 24/32* (2013.01); *H01L 2224/32245* (2013.01)

(56) References Cited

U.S. PATENT DOCUMENTS

| | | |
|---|---|---|
| 6,166,434 A | 12/2000 | Desai et al. |
| 7,663,211 B2 | 2/2010 | Noquil et al. |
| 9,281,270 B2 | 3/2016 | Geinitz et al. |
| 11,088,105 B2 | 8/2021 | Bemmerl et al. |
| 2007/0114352 A1* | 5/2007 | Victor R. Cruz ... H01L 21/6835 257/E23.047 |
| 2010/0072585 A1 | 3/2010 | Shi et al. |
| 2014/0117523 A1 | 5/2014 | Ho et al. |
| 2014/0284783 A1* | 9/2014 | Sayama ................ H01L 23/295 257/690 |
| 2020/0365549 A1* | 11/2020 | Levardo ............ H01L 23/49524 |
| 2022/0189855 A1 | 6/2022 | Feuerbaum et al. |

\* cited by examiner

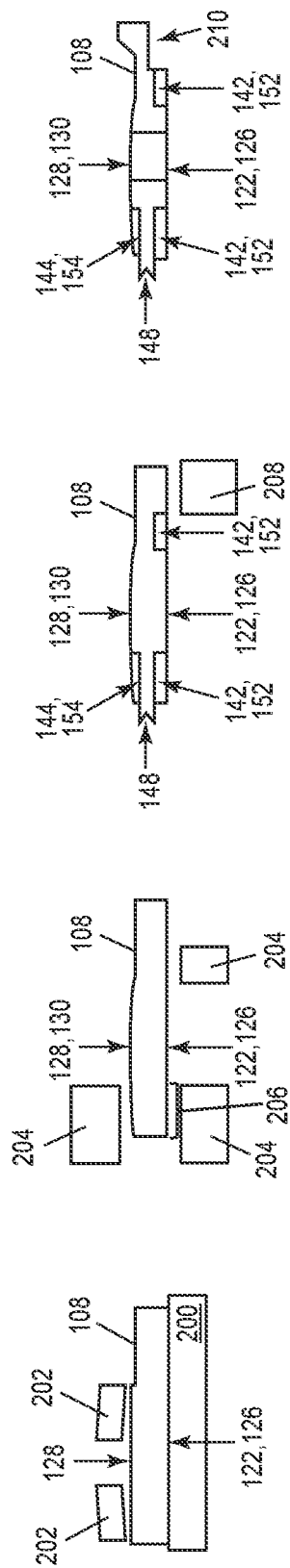

MOLDED PACKAGE HAVING AN ELECTRICALLY CONDUCTIVE CLIP WITH A CONVEX CURVED SURFACE ATTACHED TO A SEMICONDUCTOR DIE

BACKGROUND

Molded packages that use a metal clip for contacting a semiconductor die (chip) typically suffer from solder voiding. A large clip contact area on the die topside causes solder voids which is difficult to avoid during the reflow process. A vacuum reflow process may be used but results in higher package cost.

Thus, there is a need for cost-effective molded package design with reduced solder voiding between the metal clip and semiconductor die.

SUMMARY

According to an embodiment of a molded package, the molded package comprises: a semiconductor die; a substrate attached to a bottom side of the semiconductor die; an electrically conductive clip attached to a top side of the semiconductor die; and a mold compound encapsulating the semiconductor die, wherein a top side of the electrically conductive clip faces away from the semiconductor die and has an exposed flat surface that overlays the semiconductor die and is not covered by the mold compound, wherein a bottom side of the electrically conductive clip faces the semiconductor die and has a convex curved surface that is attached to the top side of the semiconductor die, wherein along a vertical cross-section of the electrically conductive clip from the exposed flat surface to the convex curved surface, the electrically conductive clip has a plano-convex shape delimited by the exposed flat surface and the convex curved surface.

According to another embodiment of a molded package, the molded package comprises: a semiconductor die; a substrate attached to a bottom side of the semiconductor die; an electrically conductive clip attached to a top side of the semiconductor die; and a mold compound encapsulating the semiconductor die, wherein a top side of the electrically conductive clip faces away from the semiconductor die and has a flat surface that overlays the semiconductor die and is not covered by the mold compound, wherein a bottom side of the electrically conductive clip faces the semiconductor die and has a convex curved surface that is attached to the top side of the semiconductor die, wherein the electrically conductive clip has a nonuniform thickness between the flat surface and the convex curved surface, wherein the nonuniform thickness is maximum at a vertex of the convex curved surface and decreases outward from the vertex.

According to an embodiment of a method of producing a molded package, the method comprises: attaching a bottom side of a semiconductor die to a substrate; attaching an electrically conductive clip to a top side of the semiconductor die such that a convex curved surface at a bottom side of the electrically conductive clip is attached to the top side of the semiconductor die and a flat surface at a top side of the electrically conductive clip faces away from the semiconductor die and overlays the semiconductor die; encapsulating the semiconductor die and the electrically conductive clip in a mold compound; and removing the mold compound from the flat surface of the electrically conductive clip, wherein along a vertical cross-section of the electrically conductive clip between the flat surface and the convex curved surface, the electrically conductive clip has a plano-convex shape delimited by the flat surface and the convex curved surface.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 10A through 10D illustrate cross-sectional views of an embodiment of forming an electrically conductive clip included in the molded package.

DETAILED DESCRIPTION

The embodiments described herein provide a molded package that uses an electrically conductive clip for contacting a semiconductor die. The top side of the electrically conductive clip faces away from the semiconductor die and has an exposed flat surface that overlays the semiconductor die and is not covered by a mold compound. The bottom side of the electrically conductive clip faces the semiconductor die and has a convex curved surface that is attached to the top side of the semiconductor die. Along a vertical cross-section of the electrically conductive clip from the flat surface to the convex curved surface, the clip has a plano-convex shape delimited by the flat surface and the convex curved surface. Accordingly, the electrically conductive clip has a nonuniform thickness between the flat surface and the convex curved surface, where the nonuniform thickness is maximum at a vertex of the convex curved surface and decreases outward from the vertex.

Described next, with reference to the figures, are exemplary embodiments of the molded package and methods of producing the molded package and electrically conductive clip.

Figure 2:
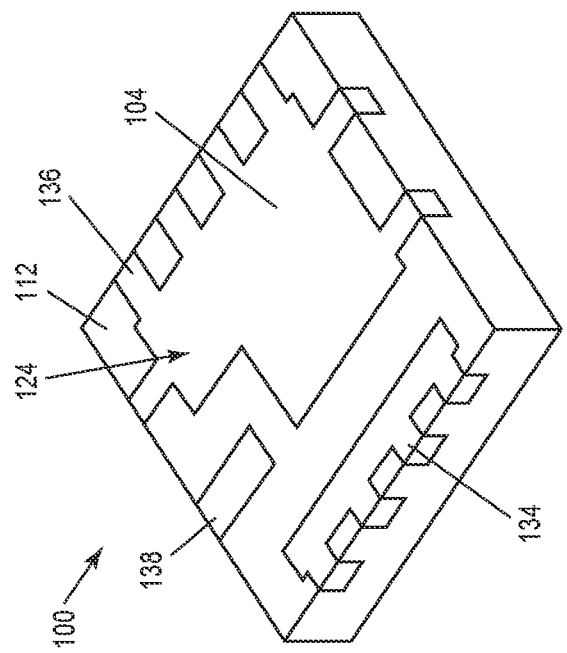
FIG. 2 illustrates a bottom perspective view of the molded package.
Figure 1:
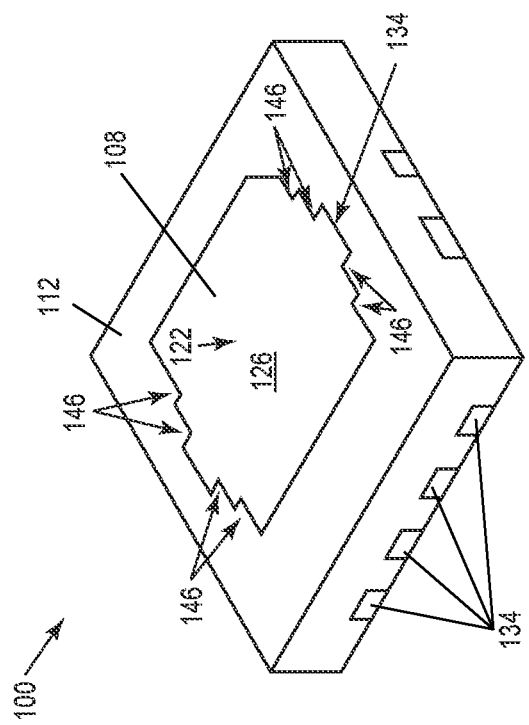
FIG. 1 illustrates a top perspective view of a molded package.
Figure 4:
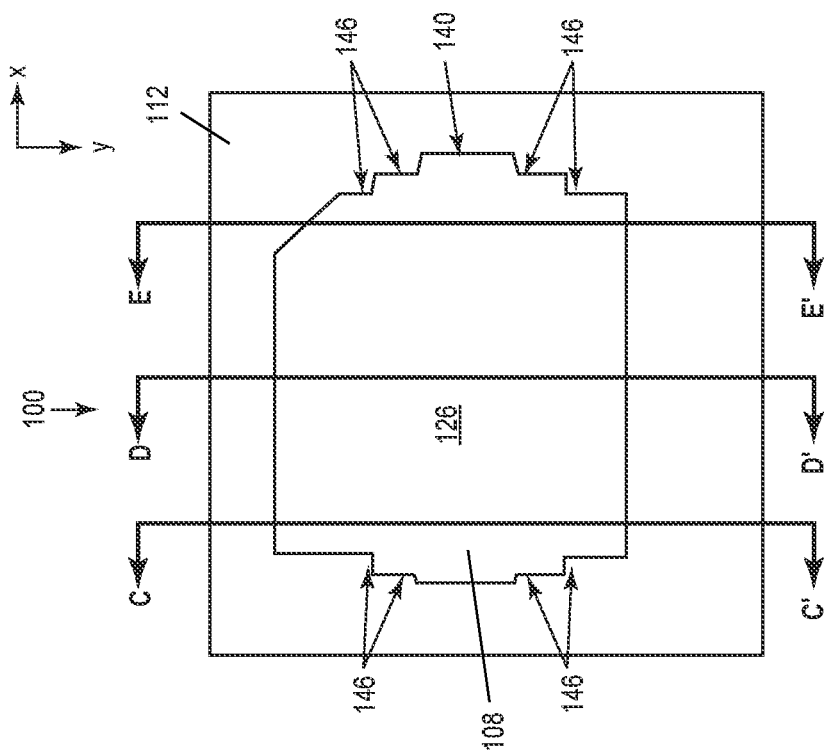
FIG. 4 illustrates the same top plan view as FIG. 3 and indicates three cross-sections C-C', D-D', and E-E' in a second orientation rotated 90 degrees with respect to the first orientation.
Figure 3:
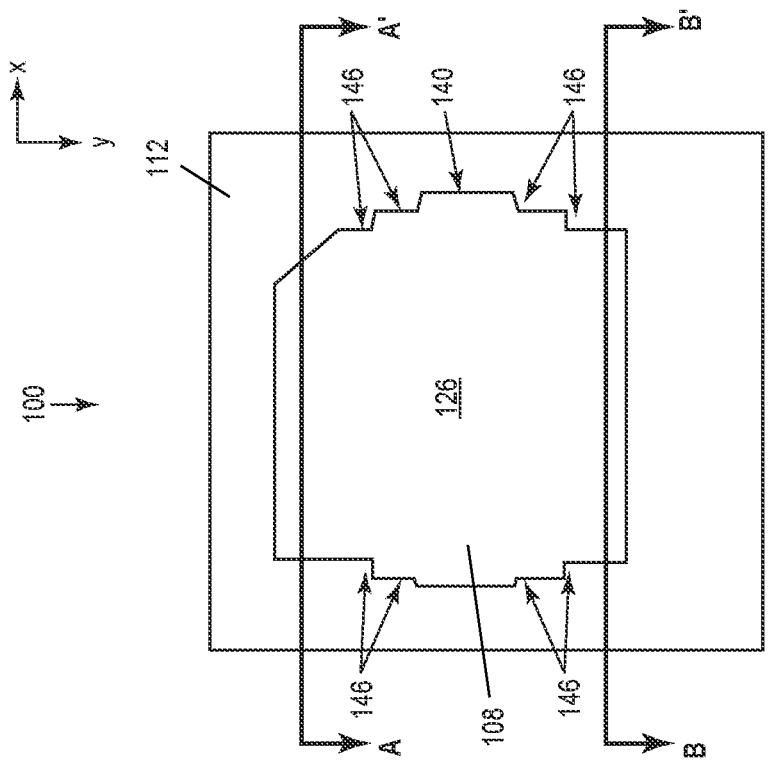
FIG. 3 illustrates a top plan view of molded package and indicates two cross-sections A-A' and B-B' in a first orientation.
Figure 5:
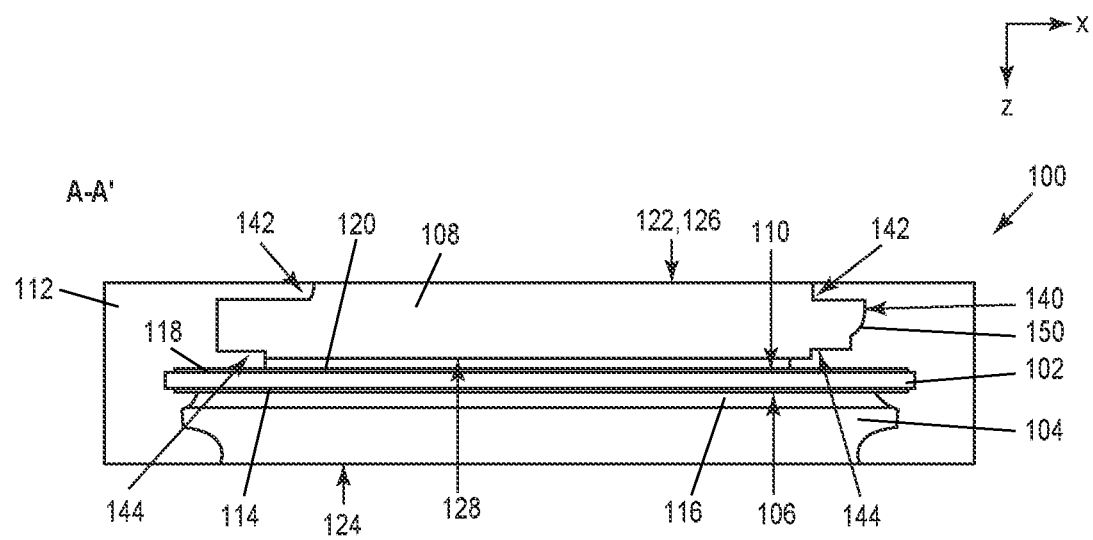
FIG. 5 illustrates a cross-sectional view of the molded package along the line labelled A-A' in FIG. 3.
Figure 6:
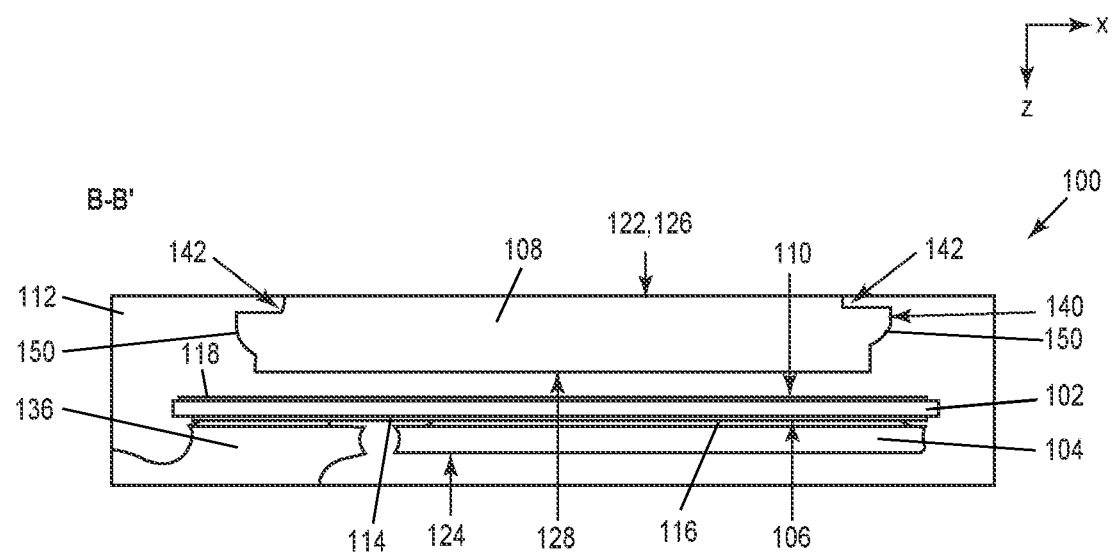
FIG. 6 illustrates a cross-sectional view of the molded package along the line labelled B-B' in FIG. 3.
Figure 7:
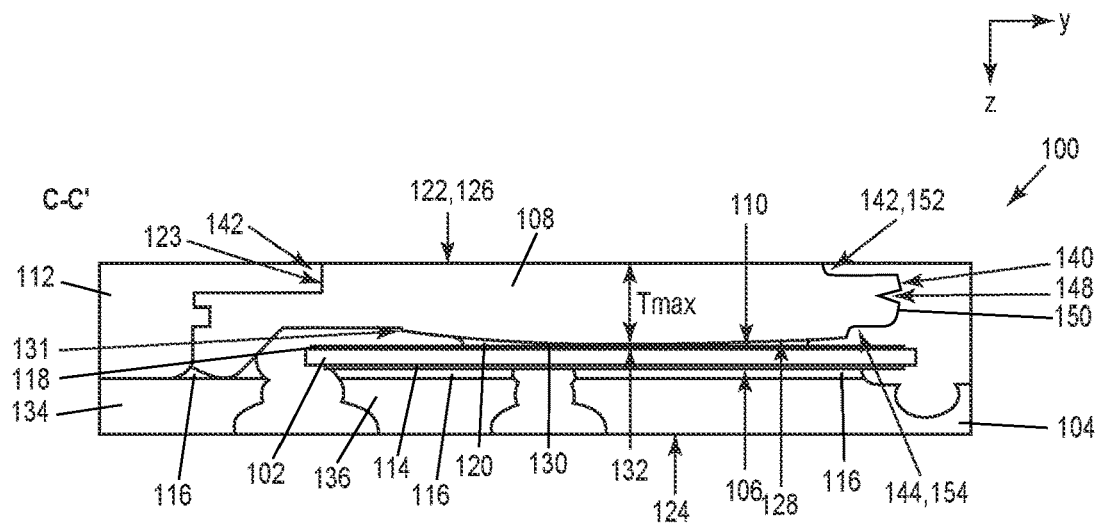
FIG. 7 illustrates a cross-sectional view of the molded package along the line labelled C-C' in FIG. 4.
Figure 8:
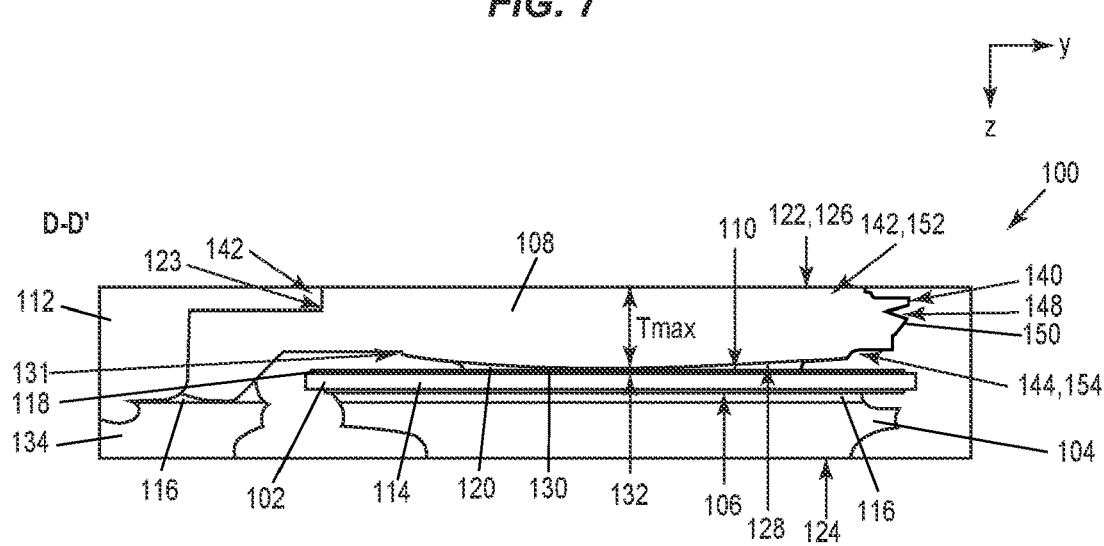
FIG. 8 illustrates a cross-sectional view of the molded package along the line labelled D-D' in FIG. 4.
Figure 9:
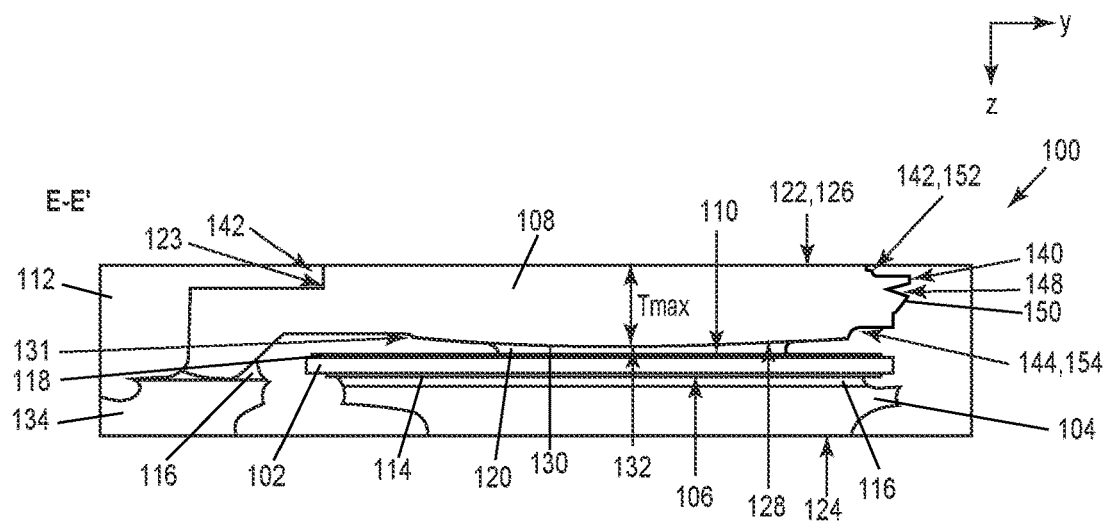
FIG. 9 illustrates a cross-sectional view of the molded package along the line labelled E-E' in FIG. 4.

FIGS. 1 through 9 illustrate an embodiment of a molded package 100. FIG. 1 illustrates a top perspective view of the molded package 100. FIG. 2 illustrates a bottom perspective view of the molded package 100. FIG. 3 illustrates a top plan view of the molded package 100 and indicates two cross-sections A-A' and B-B' in a first orientation. FIG. 4 illustrates the same top plan view as FIG. 3 and indicates three cross-sections C-C', D-D', and E-E' in a second orientation rotated 90 degrees with respect to the first orientation. FIG. 5 illustrates a cross-sectional view of the molded package 100 along the line labelled A-A' in FIG. 3. FIG. 6 illustrates a cross-sectional view of the molded package 100 along the line labelled B-B' in FIG. 3. FIG. 7 illustrates a cross-sectional view of the molded package 100 along the line labelled C-C' in FIG. 4. FIG. 8 illustrates a cross-sectional view of the molded package 100 along the line labelled D-D' in FIG. 4. FIG. 9 illustrates a cross-sectional view of the molded package 100 along the line labelled E-E' in FIG. 4.

The molded package 100 includes at least one semiconductor die 102, a substrate 104 attached to a bottom side 106 of the semiconductor die 102, an electrically conductive clip 108 attached to a top side 110 of the semiconductor die 102, and a mold compound 112.

The semiconductor die 102 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 102 is a vertical semiconductor die having a primary current path between the opposing main sides 106, 110 of the die 102. Examples of vertical power semiconductor dies include but are not limited to power Si MOSFETs (metal-oxide-semiconductor field-effect transistors), IGBTs (insulated-gate bipolar transistors), SiC MOSFETs, GaN HEMTs (high-electron mobility transistors), etc. In one embodiment, the molded package 100 is a power semiconductor package and the semiconductor die 102 is a power semiconductor die such as a Si MOSFET, IGBT, SiC MOSFET, GaN HEMT, etc. More than one semiconductor die 102 may be included in the package 100.

The substrate 104 is thermally conductive to provide a heat dissipation path for the semiconductor die 102. The substrate 104 also may be electrically conductive to provide a point of electrical contact to a terminal 114 at the bottom side 106 of the semiconductor die 102, e.g., a source or emitter terminal in the case of the semiconductor die 102 being a vertical semiconductor die mounted in a source/emitter down configuration, or a drain or collector terminal in the case of the semiconductor die 102 being mounted in a drain/collector down configuration. The gate terminal of the semiconductor die 102 is out of view and may be at the same side of the die 102 as the source/emitter terminal.

The substrate 104 may be a metal substrate such as a Cu (copper) substrate. In one embodiment, the substrate 104 is a die paddle of a lead frame. The substrate 104 may be attached to the bottom side 106 of the semiconductor die 102 by a die attach material 116 such as solder, adhesive, a sintered joint, a diffusion soldered joint, etc.

The clip 108 is electrically conductive to provide a point of electrical contact to a terminal 118 at the top side 110 of the semiconductor die 102, e.g., a drain or collector terminal in the case of the semiconductor die 102 being a vertical semiconductor die mounted in a source/emitter down configuration, or a source or emitter terminal in the case of the semiconductor die 102 being mounted in a drain/collector down configuration. In one embodiment, the clip 108 is a metal clip such as a Cu clip. The clip 108 may be attached to the top side 110 of the semiconductor die 102 by a die attach material 120 such as solder, adhesive, a sintered joint, a diffusion soldered joint, etc.

The mold compound 112 encapsulates the semiconductor die 102. The mold compound 112 may partly encapsulate both the clip 108 and the substrate 104. In one embodiment, at least part of the top side 122 of the clip 108 that faces away from the semiconductor die 102 and at least part of the bottom side 124 of the substrate 104 that faces away from the semiconductor die 102 are not covered by the mold compound 112, such that the molded package 100 has double-sided cooling via the top side 122 of the clip 108 and the bottom side 124 of the substrate 104.

The top side 122 of the clip 108 has an exposed flat surface 126 that overlays the semiconductor die 102 and is not covered by the mold compound 112. The mold compound 112 may be removed from the flat surface 126 of the clip 108 by etching, grinding, CMP (chemical mechanical polishing), etc. For some types of molding technologies such as film assisted molding (FAM), the mold compound 112 may not be formed on the flat surface 126 of the clip 108 and therefore a post-molding removal step at the front side 122 of the clip 108 may be omitted during the production of the molded package 100.

The bottom side 128 of the clip 108 faces the semiconductor die 102 and has a convex curved surface 130 that is attached to the top side 110 of the semiconductor die 102. The cross-sections A-A' and B-B' indicated in FIG. 3 intersect the direction of convex curvature (y direction in FIGS. 3 and 4) by 90 degrees. Accordingly, the corresponding cross-sectional views in FIGS. 5 and 6 are taken along a single point of the convex curvature and therefore the bottom side 122 of the clip 108 appears flat in FIGS. 5 and 6. The cross-sections C-C', D-D', and E-E' indicated in FIG. 4 run parallel to the direction of convex curvature (y direction in FIGS. 3 and 4). Accordingly, the corresponding cross-sectional views in FIGS. 7 through 9 are taken along multiple points of the convex curvature and therefore the bottom side 122 of the clip 108 is shown with a convex curvature in FIGS. 7 through 9. The convex curved surface 130 at the bottom side 128 of the clip 108 is emphasized with a dashed curved line on FIGS. 7 through 9.

Along each vertical cross-section C-C', D-D', and E-E' shown in FIGS. 7 through 9 from the (top) flat surface 126 to the (bottom) convex curved surface 130 of the clip 108, the clip 108 has a plano-convex shape delimited by the flat surface 126 and the convex curved surface 130. That is, the clip 108 is flat at the top side 122 and convex at the bottom side 128. Accordingly, the clip 108 has a nonuniform thickness between the flat surface 126 and the convex curved surface 130. The nonuniform thickness is maximum 'Tmax' at a vertex 132 of the convex curved surface 130 of the clip 108 and decreases outward from the vertex 132.

In the exemplary embodiments shown in FIGS. 7 through 9, the surface area exposed for heat dissipation at the top side 122 of the clip 108 is not limited by the extent of the convex curved surface 130 at the bottom side 128 of the clip 108 such that the exposed flat surface 126 at the top side 122 of the clip 108 has a larger area than the convex curved surface 130 at the bottom side 128 of the clip 108. For example, one or more edges 123 of the exposed flat surface 126 at the top side 122 of the clip 108 may extend beyond a corresponding edge 131 of the convex curved surface 130 at the bottom side 128 of the clip 108. The exposed flat surface 126 may also have a larger perimeter than that of the convex curved surface 130. For example, the area associated with the convex curved surface 130 may be circumscribed by the exposed flat surface 126. The foregoing advantageously provides for the possibility of more effective top-side cooling of the semiconductor die 102 compared to configurations where the surface area exposed for heat dissipation at the top side 122 of the clip 122 may be limited by the extent of the convex curved surface 130 at the bottom side 128 of the clip 108. A larger exposed surface area at the top side 122 of the clip 108 may also lower the on-state resistance (Ron) of the molded package 100.

The die attach material 120 used to attach the convex curved surface 130 of the clip 108 to the top side 110 of the semiconductor die 102 may be solder, e.g., as explained above. In the case of solder as the die attach material 120, the thickness of the solder is at a minimum at the vertex 132 of the convex curved surface 130 and increases outward from the vertex 132 which reduces the likelihood of solder voiding.

As explained above, the substrate 104 may be a die paddle of a lead frame. In this case, the clip 108 may be attached to one or more leads 134 of the lead frame at an end of the clip 108 opposite the semiconductor die 102. The mold compound 112 may partly encapsulate the one or more leads 134. The molded package 100 may include one or more additional leads, e.g., such as leads 136 that extend from the substrate, one or more gate leads 138, etc. The number and type of leads depends, e.g., on the number and type of semiconductor die(s) included in the molded package 100.

The edge 140 of the clip 108 that extends between the exposed flat surface 126 and the convex curved surface 130 may have at least one feature that enhances locking between the mold compound 112 and the clip 108. In one embodiment, the clip edge 140 includes at least one step 142, 144, 146 covered by the mold compound 112. For example, FIGS. 7 through 9 show one or more generally vertical steps 142, 144 formed in the clip edge 140 where each step 'riser' generally extends in the vertical direction (z direction in FIGS. 5 through 9) and each step 'tread' generally extends in a horizontal direction (x direction in FIGS. 5 through 9). FIGS. 3 and 4 show one or more generally horizontal steps 146 formed in the clip edge 140 where each step 'riser' generally extends in a first direction (x direction in FIGS. 3 and 4) and each step 'tread' generally extends in a second horizontal direction (y direction in FIGS. 7 through 9) transverse to the first horizontal direction.

Separately or in combination, the clip edge 140 may include at least one groove 148 filled by the mold compound 112 to enhance locking between the mold compound 112 and the clip 108.

Separately or in combination, the clip edge 140 may include a curved surface 150 covered by the mold compound 112 to enhance locking between the mold compound 112 and the clip 108.

Separately or in combination, the clip edge 140 may include a first step transition 152 from the (top) flat surface 126 of the clip 108 and a second step transition 154 from the (bottom) convex curved surface 130 of the clip 108. Both the first step transition 152 and the second step transition 154 are covered by the mold compound 112 to enhance locking between the mold compound 112 and the clip 108.

FIGS. 10A through 10D illustrate cross-sectional views of an embodiment of forming the clip 108. The steps shown in FIGS. 10A through 10D are implemented prior to attaching the clip 108 to the top side 110 of the semiconductor die 102.

FIG. 10A shows the clip 108 upside down with the top side 122 of the clip 108 supported by a rigid flat member 200. The rigid flat member 200 preserves the (top) flat surface 126 of the clip 108 during the stamping process shown in FIG. 10A. While the top side 122 of the clip 108 is supported by the rigid flat member 200, the bottom side 128 of the clip 108 is stamped using a first press 202 to form the (bottom) convex curved surface 130. The shape of the first press 202 defines the position and degree of curvature of the convex curved surface 130 of the clip 108.

FIG. 10B shows the clip 108 after formation of the convex curved surface 130 and during stamping of the bottom side 128 and/or the top side 122 of the clip 108 using a second press 204. The stamping by the second press 204 displaces material in an edge region 206 of the clip 108.

FIG. 10O shows that the material displaced by the stamping in FIG. 10B forms at least one feature configured to enhance locking between the mold compound 112 and the clip 108 in the edge region 206 of the clip 108. For example, the material displaced by the stamping in FIG. 10B may form at least one step 142, 144, 146 in the edge region 206 of the clip 108. Separately or in combination, the material displaced by the stamping in FIG. 10B may form at least one groove 148 in the edge region 206 of the clip 108. Separately or in combination, the material displaced by the stamping in FIG. 10B may have a curved surface 150 (out of view in FIG. 10O but shown in FIGS. 5 through 9). Separately or in combination, the material displaced by the stamping in FIG. 10B may form a first step transition 152 from the flat surface 126 of the clip 108 and a second step transition 154 from the convex curved surface 130 of the clip 108.

FIG. 10O also shows the clip 108 during stamping of the top side 122 of the clip 108 using a third press 208. The stamping by the third press 208 shapes the end 210 of the clip 108 for attachment to one or more leads 134 of a lead frame, e.g., as shown in FIGS. 7 through 9. The shaping of this end of the clip 108 ensures adequate height clearance, when accounting for the thickness of the semiconductor die 102.

FIG. 10D shows the clip 108 after completion of the stamping processes shown in FIGS. 10A through 10C. The clip 108 is ready for the package production process which yields the molded package 100 shown in FIGS. 1 through 9. In one embodiment, the package production process includes: attaching the bottom side 106 of at least one semiconductor die 102 to a substrate 104; attaching the clip 108 to the top side 110 of the semiconductor die 102 such that the convex curved surface 130 at the bottom side 128 of the clip 108 is attached to the die top side 110 and the flat surface 126 at the top side 122 of the clip 108 faces away from the semiconductor die 102 and overlays the semiconductor die 102; encapsulating the semiconductor die 102 and the electrically conductive clip 108 in a mold compound 112; and removing the mold compound 112 from the flat surface 126 of the electrically conductive clip 106. As explained above, the mold compound 112 may be removed from the flat surface 126 of the electrically conductive clip 108 as part of the molding process or post molding. In either case, along a vertical cross-section of the clip 108 between the flat surface 126 and the convex curved surface 130, the clip 108 has a plano-convex shape delimited by the flat surface 126 and the convex curved surface 130.

Although the present disclosure is not so limited, the following numbered examples demonstrate one or more aspects of the disclosure.

Example 1. A molded package, comprising: a semiconductor die; a substrate attached to a bottom side of the semiconductor die; an electrically conductive clip attached to a top side of the semiconductor die; and a mold compound encapsulating the semiconductor die, wherein a top side of the electrically conductive clip faces away from the semiconductor die and has an exposed flat surface that overlays the semiconductor die and is not covered by the mold compound, wherein a bottom side of the electrically conductive clip faces the semiconductor die and has a convex curved surface that is attached to the top side of the semiconductor die, wherein along a vertical cross-section of the electrically conductive clip from the exposed flat surface to the convex curved surface, the electrically conductive clip has a plano-convex shape delimited by the exposed flat surface and the convex curved surface.

Example 2. The molded package of example 1, wherein a bottom side of the substrate that faces away from the semiconductor die is not covered by the mold compound, such that the molded package has double-sided cooling via the top side of the electrically conductive clip and the bottom side of the substrate.

Example 3. The molded package of example 2, wherein the semiconductor die is a vertical power transistor die having a drain or collector terminal at the top side of the semiconductor die that is attached to the convex curved surface of the electrically conductive clip and a source or emitter terminal at the bottom side of the semiconductor die that is attached to the substrate.

Example 4. The molded package of any of examples 1 through 3, wherein an edge of the electrically conductive clip that extends between the exposed flat surface and the convex curved surface has at least one feature that enhances locking between the mold compound and the electrically conductive clip.

Example 5. The molded package of any of example 4, wherein the at least one feature comprises at least one step covered by the mold compound.

Example 6. The molded package of example 4 or 5, wherein the at least one feature comprises at least one groove filled by the mold compound.

Example 7. The molded package of any of examples 4 through 6, wherein the at least one feature comprises a curved surface covered by the mold compound.

Example 8. The molded package of any of examples 4 through 7, wherein the at least one feature comprises a first step transition from the exposed flat surface and a second step transition from the convex curved surface, and wherein both the first step transition and the second step transition are covered by the mold compound.

Example 9. The molded package of any of examples 1 through 8, wherein the substrate is a die paddle of a lead frame, wherein the electrically conductive clip is attached to one or more leads of the lead frame at an end of the electrically conductive clip opposite the semiconductor die, and wherein the mold compound partly encapsulates the one or more leads.

Example 10. The molded package of any of examples 1 through 9, wherein the convex curved surface of the electrically conductive clip is attached to the top side of the semiconductor die by solder, and wherein a thickness of the solder is at a minimum at a vertex of the convex curved surface and increases outward from the vertex.

Example 11. The molded package of any of examples 1 through 10, wherein the exposed flat surface has a larger area than the convex curved surface.

Example 12. The molded package of any of examples 1 through 11, wherein one or more edges of the exposed flat surface extend beyond a corresponding edge of the convex curved surface.

Example 13. A molded package, comprising: a semiconductor die; a substrate attached to a bottom side of the semiconductor die; an electrically conductive clip attached to a top side of the semiconductor die; and a mold compound encapsulating the semiconductor die, wherein a top side of the electrically conductive clip faces away from the semiconductor die and has a flat surface that overlays the semiconductor die and is not covered by the mold compound, wherein a bottom side of the electrically conductive clip faces the semiconductor die and has a convex curved surface that is attached to the top side of the semiconductor die, wherein the electrically conductive clip has a nonuniform thickness between the flat surface and the convex curved surface, wherein the nonuniform thickness is maximum at a vertex of the convex curved surface and decreases outward from the vertex.

Example 14. A method of producing a molded package, the method comprising: attaching a bottom side of a semiconductor die to a substrate; attaching an electrically conductive clip to a top side of the semiconductor die such that a convex curved surface at a bottom side of the electrically conductive clip is attached to the top side of the semiconductor die and a flat surface at a top side of the electrically conductive clip faces away from the semiconductor die and overlays the semiconductor die; encapsulating the semiconductor die and the electrically conductive clip in a mold compound; and removing the mold compound from the flat surface of the electrically conductive clip, wherein along a vertical cross-section of the electrically conductive clip between the flat surface and the convex curved surface, the electrically conductive clip has a plano-convex shape delimited by the flat surface and the convex curved surface.

Example 15. The method of example 14, further comprising: prior to attaching the electrically conductive clip to the top side of the semiconductor die, stamping the bottom side of the electrically conductive clip to form the convex curved surface while the top side of the electrically conductive clip is supported by a rigid flat member that preserves the flat surface.

Example 16. The method of example 14, further comprising: prior to attaching the electrically conductive clip to the top side of the semiconductor die, stamping the bottom side and/or the top side of the electrically conductive clip to displace material in an edge region of the electrically conductive clip, wherein the material displaced by the stamping forms at least one feature configured to enhance locking between the mold compound and the electrically conductive clip in the edge region of the electrically conductive clip.

Example 17. The method of example 16, wherein the material displaced by the stamping forms at least one step in the edge region of the electrically conductive clip.

Example 18. The method of example 16 or 17, wherein the material displaced by the stamping forms at least one groove in the edge region of the electrically conductive clip.

Example 19. The method of any of examples 14 through 18, wherein the material displaced by the stamping has a curved surface.

Example 20. The method of any of examples 16 through 19, wherein the material displaced by the stamping forms a first step transition from the flat surface and a second step transition from the convex curved surface.

Example 21. The method of any of examples 14 through 20, wherein the substrate is a die paddle of a lead frame, the method further comprising: attaching the electrically conductive clip to one or more leads of the lead frame at an end of the electrically conductive clip opposite the semiconductor die, wherein the mold compound partly encapsulates the one or more leads after the encapsulating.

Example 22. The method of any of examples 14 through 21, wherein attaching the electrically conductive clip to the top side of the semiconductor die comprises: attaching the convex curved surface of the electrically conductive clip to the top side of the semiconductor die by solder, wherein a thickness of the solder is at a minimum at a vertex of the convex curved surface and increases outward from the vertex.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded package, comprising:
a semiconductor die;
a substrate attached to a bottom side of the semiconductor die;
an electrically conductive clip attached to a top side of the semiconductor die; and
a mold compound encapsulating the semiconductor die,
wherein a top side of the electrically conductive clip faces away from the semiconductor die and has an exposed flat surface that overlays the semiconductor die and is not covered by the mold compound,
wherein a bottom side of the electrically conductive clip faces the semiconductor die and has a convex curved surface that is attached to the top side of the semiconductor die,
wherein along a vertical cross-section of the electrically conductive clip from the exposed flat surface to the convex curved surface, the electrically conductive clip has a plano-convex shape delimited by the exposed flat surface and the convex curved surface,
wherein the convex curved surface has a convex curvature in a first direction parallel to the top side of the semiconductor die and no curvature in a second direction parallel to the top side of the semiconductor die and intersecting the first direction.

2. The molded package of claim 1, wherein a bottom side of the substrate that faces away from the semiconductor die is not covered by the mold compound, such that the molded package has double-sided cooling via the top side of the electrically conductive clip and the bottom side of the substrate.

3. The molded package of claim 2, wherein the semiconductor die is a vertical power transistor die having a drain or collector terminal at the top side of the semiconductor die that is attached to the convex curved surface of the electrically conductive clip and a source or emitter terminal at the bottom side of the semiconductor die that is attached to the substrate.

4. The molded package of claim 1, wherein an edge of the electrically conductive clip that extends between the exposed flat surface and the convex curved surface has at least one feature that enhances locking between the mold compound and the electrically conductive clip.

5. The molded package of claim 4, wherein the at least one feature comprises at least one step covered by the mold compound.

6. The molded package of claim 4, wherein the at least one feature comprises at least one groove filled by the mold compound.

7. The molded package of claim 4, wherein the at least one feature comprises a curved surface covered by the mold compound.

8. The molded package of claim 4, wherein the at least one feature comprises a first step transition from the exposed flat surface and a second step transition from the convex curved surface, and wherein both the first step transition and the second step transition are covered by the mold compound.

9. The molded package of claim 1, wherein the substrate is a die paddle of a lead frame, wherein the electrically conductive clip is attached to one or more leads of the lead frame at an end of the electrically conductive clip opposite the semiconductor die, and wherein the mold compound partly encapsulates the one or more leads.

10. The molded package of claim 1, wherein the convex curved surface of the electrically conductive clip is attached to the top side of the semiconductor die by solder, and wherein a thickness of the solder is at a minimum at a vertex of the convex curved surface and increases outward from the vertex.

11. The molded package of claim 1, wherein the exposed flat surface has a larger area than the convex curved surface.

12. The molded package of claim 1, wherein one or more edges of the exposed flat surface extend beyond a corresponding edge of the convex curved surface.

13. A molded package, comprising:
a semiconductor die;
a substrate attached to a bottom side of the semiconductor die;
an electrically conductive clip attached to a top side of the semiconductor die; and
a mold compound encapsulating the semiconductor die,
wherein a top side of the electrically conductive clip faces away from the semiconductor die and has a flat surface that overlays the semiconductor die and is not covered by the mold compound,
wherein a bottom side of the electrically conductive clip faces the semiconductor die and has a convex curved surface that is attached to the top side of the semiconductor die,
wherein the electrically conductive clip has a nonuniform thickness between the flat surface and the convex curved surface in a first direction parallel to the top side of the semiconductor die and a uniform thickness in a second direction parallel to the top side of the semiconductor die and intersecting the first direction,
wherein the nonuniform thickness is maximum at a vertex of the convex curved surface and decreases outward from the vertex.

* * * * *